United States Patent
Hamilton

(10) Patent No.: US 9,570,253 B1
(45) Date of Patent: Feb. 14, 2017

(54) SYSTEM AND METHOD WITH TIMING SELF-CONFIGURATION

(75) Inventor: James R. Hamilton, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 882 days.

(21) Appl. No.: 13/305,286

(22) Filed: Nov. 28, 2011

(51) Int. Cl.
| | |
|---|---|
| H01H 3/00 | (2006.01) |
| H01H 11/00 | (2006.01) |
| H05B 39/08 | (2006.01) |
| H01H 3/26 | (2006.01) |
| H03K 17/96 | (2006.01) |

(52) U.S. Cl.
CPC ............ H01H 11/0062 (2013.01); H01H 3/26 (2013.01); H05B 39/08 (2013.01); H03K 17/96 (2013.01)

(58) Field of Classification Search
CPC ........ H01H 1/0062; H01H 3/26; H01H 9/168; H05B 39/08; H03K 17/96
USPC ............ 307/139, 140, 141, 365, 153, 29, 80
See application file for complete search history.

(56) References Cited

U.S. PATENT DOCUMENTS

| | | | |
|---|---|---|---|
| 5,804,991 A | 9/1998 | Hu | |
| 6,747,368 B2 | 6/2004 | Jarrett, Jr. | |
| 7,239,045 B2 * | 7/2007 | Lathrop et al. | 307/80 |
| 2003/0075982 A1 * | 4/2003 | Seefeldt | H02J 9/06 |
| | | | 307/29 |
| 2003/0235017 A1 * | 12/2003 | Liu | H01H 9/56 |
| | | | 361/2 |
| 2004/0172204 A1 * | 9/2004 | Eaton | H02J 3/005 |
| | | | 702/57 |
| 2005/0012505 A1 * | 1/2005 | Wilson | G01R 31/3278 |
| | | | 324/418 |
| 2008/0116898 A1 * | 5/2008 | Washington | 324/521 |
| 2008/0177802 A1 | 7/2008 | Haye et al. | |
| 2008/0309379 A1 | 12/2008 | Carroll | |
| 2009/0091193 A1 * | 4/2009 | Page | 307/140 |
| 2009/0172265 A1 | 7/2009 | Park et al. | |
| 2009/0196417 A1 | 8/2009 | Beaver et al. | |

OTHER PUBLICATIONS

Venkat Anant, "Digital Signal Controller Based Automatic Transfer Switch," 10 pages, Senior Staff Applications Engineer, Freescale Semiconductor. Presented in Session PET 02 on Emerging Technologies at Power Electronics Technology 2005 Conference, Baltimore, MD, Oct. 25-27, 2005.

* cited by examiner

Primary Examiner — Rexford Barnie
Assistant Examiner — Xuan Ly
(74) Attorney, Agent, or Firm — Robert C. Kowert; Meyertons, Hood, Kivlin, Kowert & Goetzel, P.C.

(57) ABSTRACT

A method of operating an automatic transfer switch to switch an electrical load from one power source to another power source includes measuring one or more characteristics of a switching circuit in the automatic transfer switch. A value of one or more timing variables is determined based on the measured characteristics of the switching circuit. The switching circuit is operated to close relays in the automatic transfer switch. The timing of closing of the relays is based on the value of the timing variables.

30 Claims, 8 Drawing Sheets

SYSTEM AND METHOD WITH TIMING SELF-CONFIGURATION

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 208V). A network of cabling, bus bars, power connectors, and power distribution units, is used to deliver the power at the lower voltage to numerous specific components in the facility.

Primary power systems for computer systems in operation typically need to be maintained or reconfigured from time to time. Some data centers, for example, have "single threaded" distribution via the electrical power supply to the floor and/or to the rack, and in which maintenance can only be performed when the components using power in the data center, such as servers, are shut-off. The down-time associated with maintenance and reconfiguration of primary power systems in a data center may result in a significant loss in computing resources. In some critical systems such as hospital equipment and security systems, down-time may result in significant disruption and, in some cases, adversely affect health and safety.

Some systems include dual power servers that provide redundant power for computing equipment. In some systems, an automatic transfer switch ("ATS") provides switching from a primary power system to a secondary (e.g., back-up) power system. In a typical system, the automatic transfer switch automatically switches the computing equipment to the secondary system upon detecting a fault in the primary power. To maintain the computing equipment in continuous operation, the automatic transfer switch may need to make the transfer to secondary power system rapidly (for example, within about 16 milliseconds).

Many power systems supply alternating current to electrical systems (for example, 60 cycles per second in North America and 50 cycles per second in many other parts of the world). During power switching in an automatic transfer switch, mechanical relays in the automatic transfer switch can be damaged by high current inrush. The risk of damage to a mechanical relay from current inrush can be reduced by controlling the switching to occur at the "zero crossing" of the alternating current of the secondary power source.

In any mechanical relay, there is a delay between the time the relay is energized and the time it is closed (typically, on the order of several milliseconds). To account for this delay, some automatic transfer switches are designed to trigger the relay in advance of the expected zero crossing by a predetermined lead time. Nevertheless, due to manufacturing differences and other differences between relays, and differences in characteristics and operating conditions in automatic transfer switches, switching in these automatic transfer switches may deviate substantially from the zero crossing. Such deviations may cause a failure of the automatic transfer switch.

Figure 1:
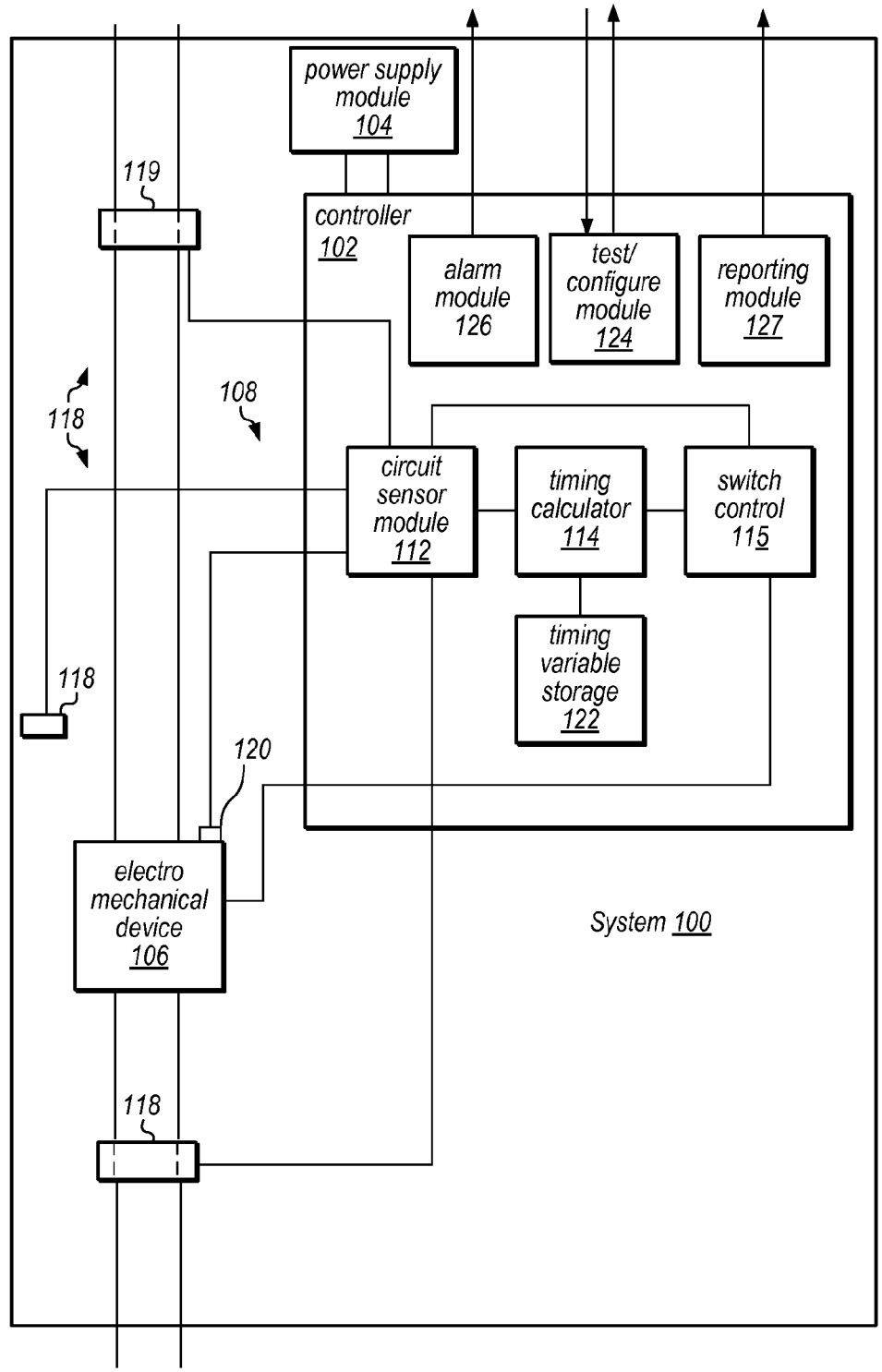
FIG. 1 illustrates a system having a timing calculator that provides information for controlling electromechanical devices in a system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of methods and systems for operating systems with electromechanical devices are disclosed. According to one embodiment, a method of operating an automatic transfer switch to switch an electrical load from one power source to another power source includes measuring one or more characteristics of a switching circuit in the automatic transfer switch. A value of one or more timing variables is determined based on the measured characteristics of the switching circuit. The switching circuit is operated to close relays in the automatic transfer switch. The timing of the closing of the relays is based on the values of the timing variables.

According to one embodiment, a method of operating a system having one or more electromechanical devices includes performing a self-configuration. The self-configuration includes measuring characteristics of an electromechanical circuit in the system and determining a value of one or more timing variables based the measured characteristics of the circuit. During operation of the electromechanical circuit, the timing of operation of electromechanical devices in the circuit is controlled based on the values of the timing variables.

According to one embodiment, an automatic transfer switch includes one or more relays, a processor, and a memory. The relays switch power to one or more power outputs. The memory includes program instructions that are executable by the processor to measure characteristics of a switching circuit including the relays. A value may be determined of one or more timing variables based on the measured characteristics of the switching circuit. The switching circuit may be operated to close one or more relays in the automatic transfer switch. The timing of the closing of relays may be based on the values of the timing variables.

According to one embodiment, a method of self-configuration of a system having one or more electromechanical devices includes measuring characteristics of an electromechanical circuit in the system. A value of one or more timing variables is determined based on the measured characteristics of the electromechanical circuit. The values of the timing variables are stored in memory. The value of the timing variables can be used by the system to control timing of operation of the electromechanical devices in the system.

As used herein, measuring "characteristics" of a circuit may include measuring a response, output, or performance of the circuit, or a portion thereof, or measuring characteristics of one or more individual components of the circuit. Examples of measured characteristics of components of a circuit include electrical output (for example, a voltage output under given test conditions), performance characteristics (such as the speed of switch), physical characteristics (such as size an operating temperature), or environmental conditions (for example, such as ambient temperature or pressure at the location of the component).

As used herein, a "control event" means an event in which an action is performed to control a system, device, or other component. A control event may be, for example, energizing of an electromechanical device (such as energizing a relay), an instruction to close a relay executed in a programmable logic controller, a voltage applied to a device, or failure detected in a component or system (such as a failure of a primary power system).

As used herein, "delay" means a time elapsed between a first event and a later event. A delay may be, for example, the time elapsed from the time an instruction to perform an operation is executed in a processor and the time the operation is actually performed.

As used herein, an "electromechanical circuit" means a circuit that includes one or more electromechanical devices.

As used herein, an "electromechanical device" means a device that can convert an electrical current, voltage, or signal input to a mechanical output, or convert a mechanical input to an electrical current, voltage, or signal output. In some embodiments, an electromechanical device performs more than one conversion. For example, a relay may convert electrical current into motion of a switch arm, and the closing of the switch arm on a contact may produce an electrical output. Examples of electromechanical devices include relays, motors, generators, circuit breakers, thermostats, dynamometers, loudspeakers, pressure sensors, flow sensors, rotation sensors, float switches, accelerometers, solenoid latches, actuators, and fuel injector nozzles.

As used herein, a "switching circuit" means any combination of elements that can be operated to open or close an electrical switch.

As used herein, a "timing variable" means any variable whose value can be used to at least partially control the timing of an event, action, or operation.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "power distribution unit" means any device, module, component, or combinations thereof, which can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.). A power distribution unit may include a transformer, power monitoring, fault detection, and isolation.

As used herein, "floor power distribution unit" refers to a power distribution unit that can distribute electrical power to various components in a computer room. A power distribution unit may be housed in an enclosure, such as a cabinet.

As used herein, "rack power distribution unit" refers to a power distribution unit that can be used to distribute electrical power to various components in a rack. A rack power distribution may include various components and elements, including wiring, bus bars, connectors, and circuit breakers. In some embodiments, a rack power distribution unit may distribute power to only some of the electrical systems in a rack. In some embodiments, a single rack includes two or more rack power distribution units that distribute power to different sets of electrical systems in the rack. For example, one rack may include a left rack power distribution unit that distributes power to half of the servers in the rack, and a right rack power distribution unit that distributes power to the other half of the servers in the rack.

As used herein, "primary power" means any power that can be supplied to an electrical load, for example, during normal operating conditions.

As used herein, "reserve power" means power that can be supplied to an electrical load upon the failure of, or as a substitute for, primary power to the load.

As used herein, "circuit board" means any board or plate that has one or more electrical conductors transmitting power, data, or signals from components on or coupled to the circuit board to other components on the board or to external components. In certain embodiments, a circuit board is an epoxy glass board with one or more conductive layers therein. A circuit board may, however, be made of any suitable combination of materials.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

In some embodiments, a system includes a circuit for detecting timing information for one or more electromechanical devices in the system. Timing information may be acquired, for example, with one or more sensing circuits in the system. Timing information may include the delay from the time of a control event, such as sending a control signal, until the time of operation of a device in the system. Operation may include any of various events, including closing of a valve, opening of a valve, closing of a switch, or injection of a fluid. Timing information acquired by the system may be used to control the timing of operation of electromechanical devices in the system.

FIG. 1 illustrates a system that includes a timing calculator that provides information for controlling electromechanical devices in the system. System 100 includes controller 102, power supply module 104, and electromechanical device 106. Electromechanical device 106, controller 102, power supply module 104, and any of various other elements of system 100 may be connected to form circuit 108.

System 100 may be any system that includes a device, a mechanism, or a machine that is at least partially controlled automatically. Examples of systems include an automotive engine, a fuel injection system, a brake system, an automatic guided vehicle, a robotic system, or an electrical power generation system.

In some embodiments, controller 102 is a programmable logic controller. Controller 102 includes circuit sensor 112, timing calculator 114, and switch control 115. Circuit sensor module 112 is coupled to elements of circuit 108 and sensors 118. In some embodiments, a circuit sensor module 112 is coupled to conductors in a circuit. For example, circuit sensor module 112 is coupled to input power conductors by way of sensor 119.

Circuit sensor module 112 is coupled to sensing devices 118 in the system. Circuit sensor module 112 may control, and receive information from, sensing devices 118. Sensing devices 118 include electromechanical device sensor 120. An electromechanical device sensor may detect one or more physical or operational characteristics of an electromechanical device. Examples of sensors for a circuit may include temperature sensors, humidity sensors, and pressure sensors.

In one embodiment, environmental conditions in or around a system may be sensed. For example, a thermocouple may be used to assess the temperature on the case of an electromechanical device, such as a motor.

Timing calculator 114 may calculate values for use in controlling system 100. The computed values may be used, in various embodiments, to control the timing of operation of electromechanical device 106. In some embodiments, timing calculator 114 uses information relating to circuit characteristics and conditions acquired from sensing devices 118 to determine timing variables for operating electromechanical device 106. Calculator 114 is coupled to memory 122. Timing calculator may store timing variables in memory 122.

Controller 102 includes test/configure module 124. Test/configure module 124 of may perform test and self-configuration of system 100. A test and self-configuration may include determining values of a timing variable for use in operating electromechanical devices 106. In one embodiment, a test/self-configuration sequence is run when system 100 is initialized.

Controller 102 includes alarm module 126 and reporting module 127. Alarm module 126 may be used to send alarms from system 100. In one embodiment, an alarm is sent if a test initiated by test/configure module 124 indicates that the system cannot perform within predetermined parameters. Reporting module 127 may export information to devices external to system 100. In some embodiments, reporting module 127 exports timing information relating to characteristics and performance of electromechanical devices in system 100.

In various embodiments, an electromechanical device is operated automatically. In some embodiments, an electromechanical device operates in response to a control event. Examples of control events include: execution of a program instruction, sending of a control signal, applying a voltage to a device, or sensing a voltage or signal. In one embodiment, an electromechanical device responds to a program instruction executed on a controller. There may be a delay between the time of the control event and the time the device operates (for example, the time the contacts of relay close, or the time a valve opens.)

Figure 2:
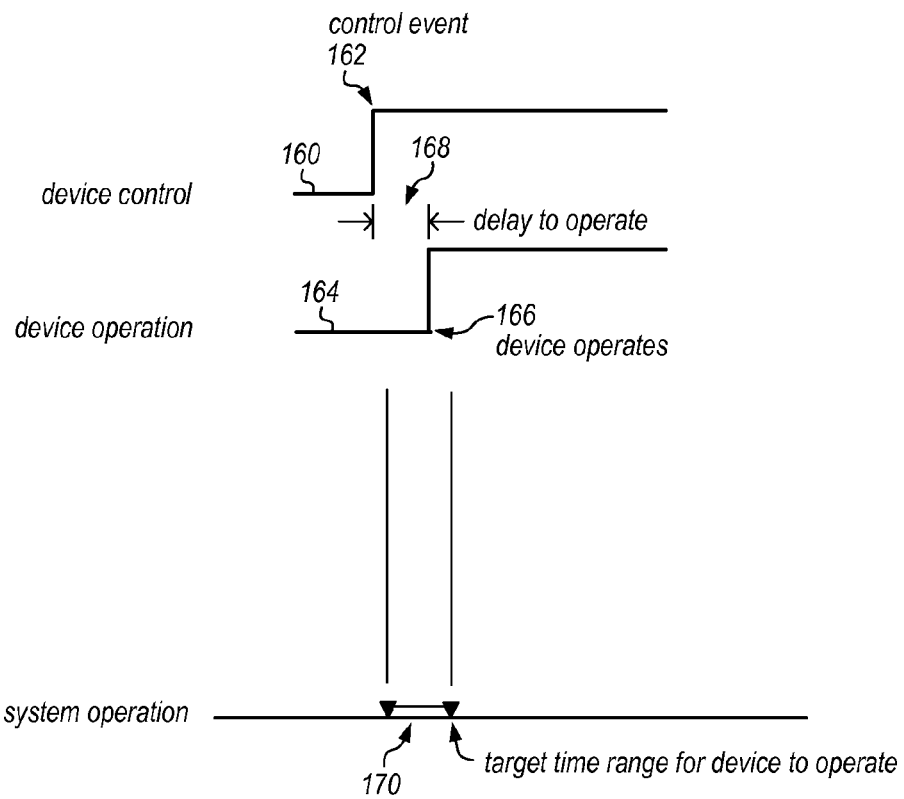
FIG. 2 is a timing diagram illustrating control of a device according to one embodiment.

FIG. 2 is a timing diagram illustrating control of a device according to one embodiment. Plot 160 corresponds to the timing of a control event for a device. Time 162 represents the occurrence of a control event. Plot 164 corresponds to operation of the device. Operation of the device may be, for example, the movement of a working element of the device, such as closing of a relay, the opening of a port on a fuel injection device, or the opening of a valve. Time 166 represents the time at which the device responds to the control event at time 162. Delay 168 represents the amount of time elapsed between the control event and the time the device operates.

A control event may be timed to cause operation of the device to occur within an appropriate target range for a system. For example, a control system may control a fuel injector to operate within a specified time range relative to the cycle of an engine. For example, in FIG. 2, operation of the device at 166 falls within an acceptable range 170.

In many control system designs, the timing of controlling an electromechanical device varies from system to system. Each system build may have slightly different timing characteristics than other system builds. Variations in the timing from device may be caused by any of various characteristics of the system. Examples of such characteristics include manufacturing variations in electromechanical device, variations of an electromechanical device from lot to lot, variations in environmental conditions (such as temperature, pressure, or humidity), variations in the source of supply of a device, and variations in software (for example, one version of the controller software many have a longer instruction set than another version). As a result of variations in characteristics of electromechanical devices, environment, a delay in a device (for example, the time elapsed from control event to device operate) may vary from system to system.

In some cases, a delay in an electromechanical device varies within a particular system over time. For example, corrosion or wear in moving elements of a relay may cause the delay of the system from control event to the making of the relay may change over time.

Figure 3:
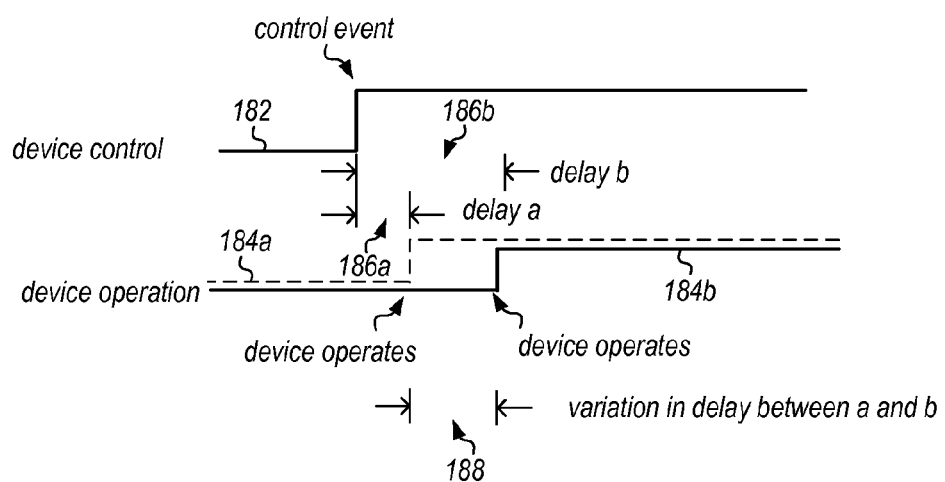
FIG. 3 is a timing diagram illustrating a comparison of two different delays in operation of a device.

FIG. 3 is a timing diagram illustrating a comparison of two different delays in operation of a device or devices. Plot 180 illustrates the occurrence of a control event. The control event may occur at 182. Plot 184a illustrates the response of a device to the control event. Plot 184b illustrates the response of a device to the same control event. Delay 186a is the delay between control event 182 and the response to the device plotted in 184a. Delay 186b is the delay between control event 182 and the response to the device plotted in 184b. In some embodiments, variation 188 between delay 186a and delay 186b reflects manufacturing variations between two different devices, or differences in supplier for of differences in lot number for a device. In some embodiments, variation 188 between delay 186a and delay 186b reflects differences in environmental conditions, such as temperature, pressure, or humidity. In some embodiments, variation 188 between delay 186a and delay 186b reflects differences in software between two systems.

In some embodiments, a system having an electromechanical device performs a self-configuration to establish timing parameters for its operation. Characteristics of a circuit including the electromechanical device may be measured by the system and a value determined for a timing variable based on the measurement. During operation, the timing variable is used to control the timing of operation of the electromechanical device.

Figure 4:
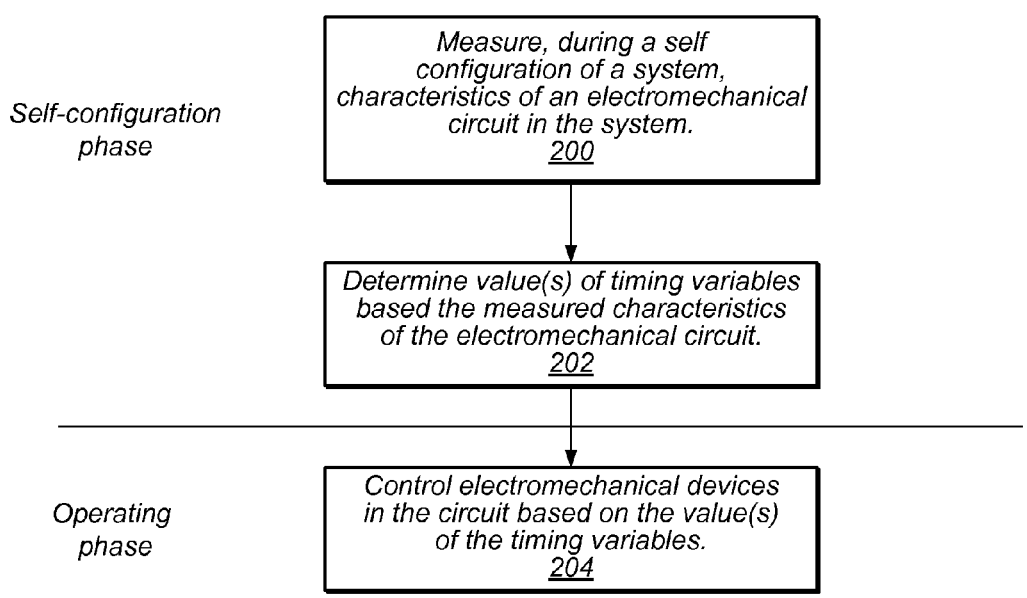
FIG. 4 illustrates one embodiment of operation of a system that includes a self-configuration to set timing variables for electromechanical devices in the system.

FIG. 4 illustrates one embodiment of operation of a system that includes a self-configuration to set timing variables for an electromechanical device in the system. Beginning at 200, a self-configuration may be initiated by the system. At 200, one or more characteristics of an electromechanical circuit in the system are measured. The measurements may be acquired from sensors or circuit elements in the system. Examples of characteristics that may be measured include: timing of one or more events in the system, conditions of various components or locations (such as ambient pressure, temperature, or humidity), electrical characteristics in a circuit, or environmental conditions in the system.

At 202, a value of a timing variable is determined. The value of the timing variable may be based on one or more of the measured characteristics of the electromechanical circuit. The value of the timing variable may be stored in memory so that it can be accessed during operation of the system to control the system. In some embodiments, the timing variable accounts for variations in characteristics of a circuit or devices. In some embodiments, a timing variable is inserted into the software used to control the system.

In certain embodiments, an alarm is triggered from a self-configuration or self-test. In one embodiment, an alarm is triggered if the timing calculations indicate that device will not be able to perform within predetermined specifications. In some embodiments, an alarm is sent over a network to an external device. In certain embodiments, a system may automatically shut down if predetermined timing conditions are met during a self-configuration or self-test.

After completion of the self-configuration procedure, the system may be ready to be placed into service. At 204, the electromechanical circuit in the system is operated to control one or more electromechanical device(s). The timing of operation of the electromechanical device may be based on the value of the timing variable. For example, the timing of operation of a fuel injection device may vary based on the value of the timing variable. In some embodiments, the timing of a control event is based on a delay calculated for operation of an electromechanical device during the self-configuration of the system.

Based on the method described above, timing of operation of systems may be dynamically controlled on a per device basis.

Self-configuration to establish timing of a device may be performed at different times during the life cycle of a system. In some embodiments, self-configuration for timing of a system is performed each time the system is initialized. In some embodiments, self-configuration is performed after the system has been placed into service. A self-configuration may be performed at various regular or irregular intervals during operation.

Figure 5:
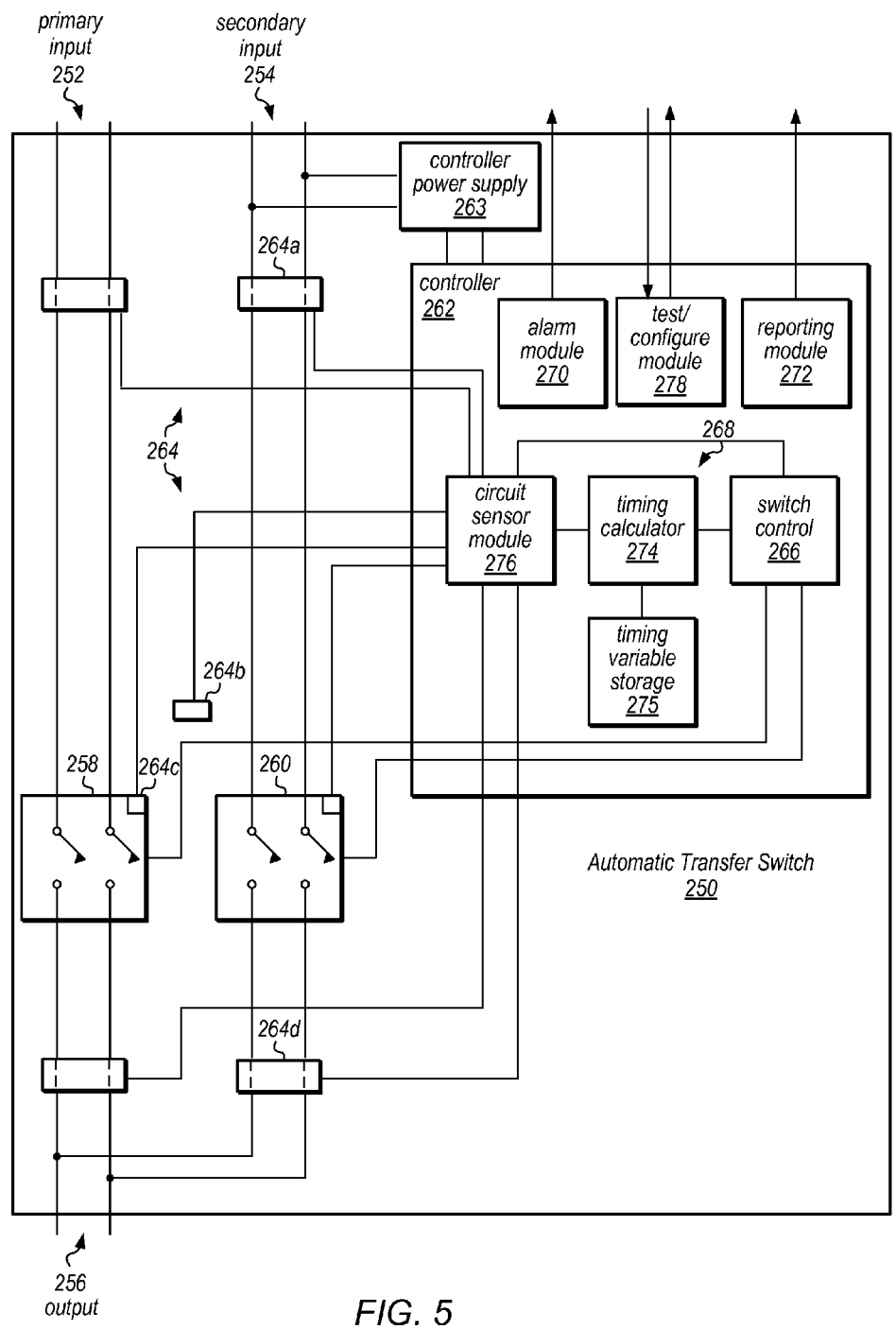
FIG. 5 is a block diagram illustrating one embodiment of an automatic transfer switch with a timing self-configuration mechanism.

In some embodiments, an automatic transfer switch includes a timing mechanism that accounts for variations in switching circuits and components in the automatic transfer switch. Variations may occur from switch to switch (such as when one switch has a relay with slightly different characteristics than another switch), or over time for a particular switch (such as when changes to elements of the switch or its operating conditions affect timing of the switching circuit). FIG. 5 is a block diagram illustrating one embodiment of an automatic transfer switch with a timing self-configuration mechanism. Automatic transfer switch 250 includes primary input 252, secondary input 254, and output 256. Automatic transfer switch 250 may automatically switch between primary input 252 and secondary input 254. Switching may occur, for example, upon detection of a fault in primary input 252.

Each of primary input 252 and secondary input 254 may receive a separate alternating current power input. The primary input 252 may be connected to a primary power input. Secondary input 254 may be coupled to a reserve power input. Output 254 may be coupled to a load. The load may be, in one example, one or more computing systems in a data center.

Automatic transfer switch 250 includes primary-side input side relays 258, secondary-side relays 260, controller 262, controller power supply 263, and circuit sensors 264. Primary-side input side relays 258 may be opened and closed to switch power from primary input 252 to output 256. Secondary-side input side relays 260 may be opened and closed to switch power from primary input 254 to output 256.

Controller 262 may be a programmable logic controller. Controller 262 may control switching operations in automatic transfer switch 250. Controller 262 includes switch control 266, timing adjustment mechanism 268, alarm module 270, and reporting module 272. Timing adjustment mechanism 268 includes timing computer 274, timing variable storage 275, circuit sensor module 276, and test/configuration module 278.

Circuit sensors 264 may sense various characteristics and conditions of a circuit or its components. Sensors 264a may sense current or voltage in primary input 252 and secondary input 254. Sensor 264b may sense conditions in one or more locations in or around automatic transfer switch 250, such as inside a chassis for automatic transfer switch 250. Sensors 264c may sense one or more characteristics or conditions of relay 258 or relay 260. Sensors 264d may sense current or voltage in output 256.

Test/configure module 278 may perform test and self-configuration of automatic transfer switch 250. A test and self-configuration may include determining values of a timing variable for use in operating primary-side relays 258, secondary-side relays 260, or both. Timing variables may be based on characteristics and conditions in circuits of automatic transfer switch 250 and its components. In one embodiment, a test/self-configuration sequence is run when system 100 is initialized.

Alarm module 270 may be used to send alarms from automatic transfer switch 250 to external devices. An alarm may be sent, for example, via a network connection to external devices. In one embodiment, an alarm is sent if a test initiated by test/configure module 278 indicates that the system cannot perform within predetermined parameters.

Reporting module 272 may be used to report information acquired during operation of automatic transfer switch 250 to external devices. In some embodiments, trends or patterns relating to timing in a switching circuit may be monitoring, tracked, and reported.

For illustrative purposes, various elements of timing adjustment mechanism 268 have been described as discrete elements. Nevertheless, any or all of the functions of timing mechanism 268, including timing variable computation, self-configuration, self-test, and sensor control, may integrated, for example, in software stored on and executed by a programmable logic controller.

In an embodiment, a method of operating an automatic transfer switch includes measuring one or more characteristics of a switching circuit in the automatic transfer switch and determining a value for a timing variable based on the measurement. Measurement of the switching circuit and determining the value of the timing variable may be performed during a self-configuration of the automatic transfer switch (for example, when the automatic transfer switch is first activated). During operation, the timing variable may be used to control the timing of the closing of the relay (for example, to close the relay at or near a zero crossing of the secondary power input).

Figure 6:
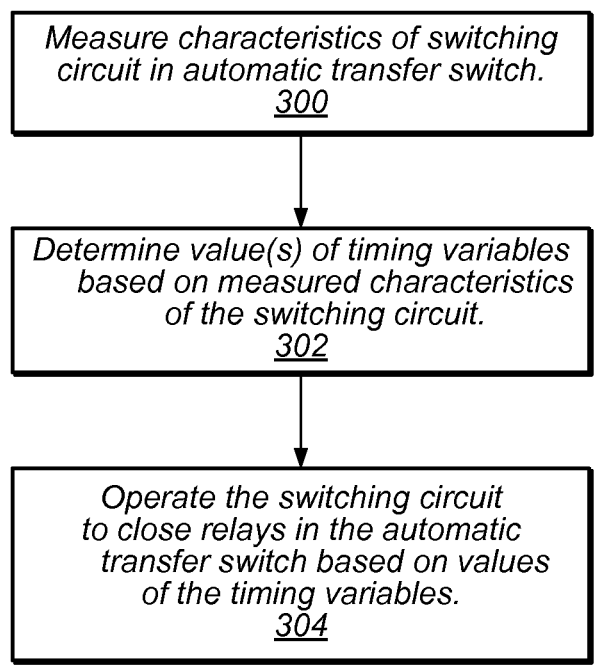
FIG. 6 illustrates one embodiment of controlling an automatic transfer switch that includes determining a timing variable for operating the automatic transfer switch.

FIG. 6 illustrates one embodiment of controlling an automatic transfer switch that includes determining a timing variable for operating the automatic transfer switch. At 300, characteristics of a switching circuit in the automatic transfer switch are measured. The characteristics may include, for example, timing of one or more of the relays or circuit operations, physical characteristics of the relays, or environmental conditions of the automatic transfer switch. Measured characteristics may vary based on factors including: manufacturing tolerances of different relays, source of supply for a relay, batch of a relay, the version of software running on the automatic transfer switch, and environmental conditions (for example, how hot the system is running).

At 302, a value of determined for a timing variable based on the measured characteristics of the switching circuit. The value of the variable may vary depending on the measured characteristics. For example, the value of a variable may be larger or smaller depending on the measured characteristics. In some embodiments, the value of the variable varies depending on the delay time of one or more relays in the device.

In various embodiments, the timing variable may account for physical and performance from relay to relay. Examples of characteristics of a relay that may be accounted for in a timing variable include spring tension, winding resistance, contact spacing.

At 304, the switching circuit is operated to close one or more relays in the automatic transfer switch. The timing of the closing of the relays may be based on the value of at least one of the timing variables.

In some embodiments, an automatic transfer switch uses timing variables to control the timing of operation of relays on the secondary input side of the automatic transfer switch. In certain embodiments, an automatic transfer switch uses timing variables to control the timing of operation of relays on a primary input side of the automatic transfer switch, or on both the primary and secondary input sides of the automatic transfer switch.

In some embodiments, 300 and 302 are performed as part of a self configuration or self test of an automatic transfer switch. A self-configuration may be performed, for example, when the automatic transfer switch is first placed into service at a data center. In some embodiments, a self configuration or self test is performed. At each self configuration, the system may re-compute values for the timing variables based on current conditions. The value of a timing variable may change, for example, if a relay has degraded in performance and takes longer to close, or if the system is running hotter or colder than it was at the time of the last self configuration.

In some embodiments, timing variables computed during a self configuration are later used to control operation of relays relative to a zero crossing of a power input to an automatic transfer switch. The zero crossing may detected based on voltage, current, or both. During operation of the system, the timing variable may be applied to close relays within a predetermined range of a zero crossing. In some embodiments, target time of closing may be slightly before the zero crossing time.

Figure 7:
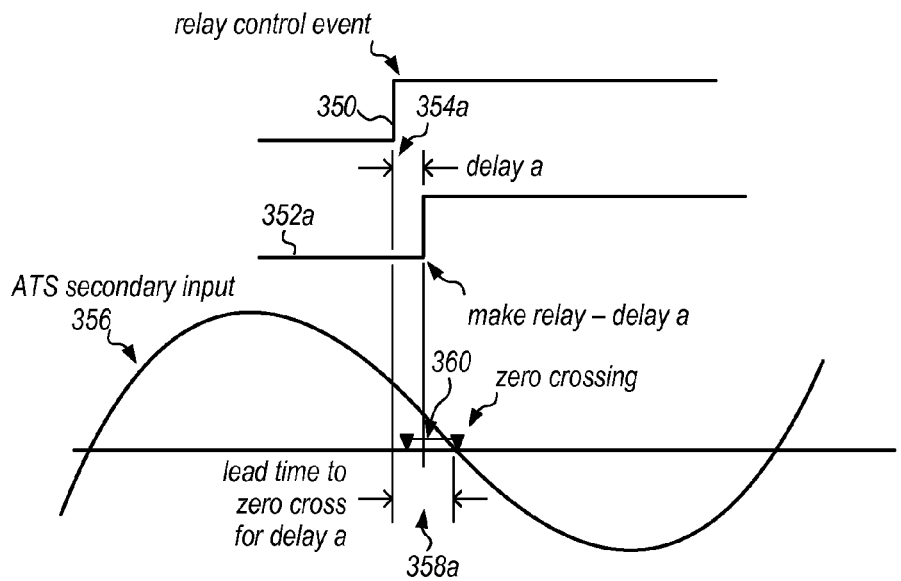
FIG. 7 is a timing diagram that illustrates one embodiment of controlling timing of relays relative to a zero crossing of a secondary power input of an automatic transfer switch.

FIG. 7 is a timing diagram that illustrates one embodiment of controlling timing of relays relative to a zero crossing of a secondary input. Plot 350 represents the timing of control event for a relay. The control event may be triggered, for example, upon detection of a fault in a primary power input to the automatic transfer switch. Plot 352a represents closing of the relay. Delay 354a is the delay from the time of the control event to the time of the making of the relay. During self-configuration of the automatic transfer switch, a value of a timing variable may be determined. In one embodiment, the value of the timing variable corresponds to the amount of delay 354a.

During operation of the automatic transfer switch, the secondary power input may be measured. The secondary power input may be in form wave 356 shown in FIG. 7. Upon detection of a fault in the primary power input, the automatic transfer switch may operate to close the relay on the secondary power input. In one embodiment, the timing variable is used to determine a value of lead time 358a relative to the zero crossing that will result in the making of the relay in range 360.

Figure 8:
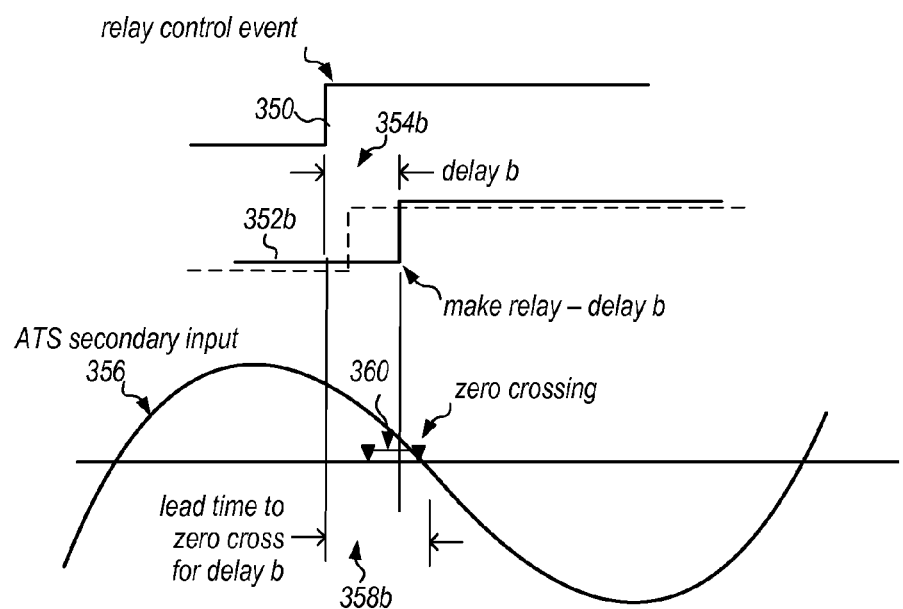
FIG. 8 is a timing diagram that illustrates an embodiment in which a relay has a longer delay than the example shown in FIG. 7.

FIG. 8 is a timing diagram that illustrates an embodiment in which a relay has a longer delay than the example shown in FIG. 7. Plot 352b represents closing of the relay. Delay 354b is the delay from the time of the control event to the time of the making of the relay. (For comparison, the relatively shorter time of delay for the relay in the example of FIG. 7 is shown in dashed line 352a). During self-configuration of the automatic transfer switch, a value of a timing variable may be determined. The value of the timing variable may be chosen to account for the longer delay 354*b* relative to delay 354*a*. The timing variable may be used to trigger a control event that has a larger lead time 358*b* from the control event to the zero crossing. Thus, in these examples, the larger the delay in operation of the relay, the larger the lead time to achieve closing of the relay within the target time range.

Figure 9:
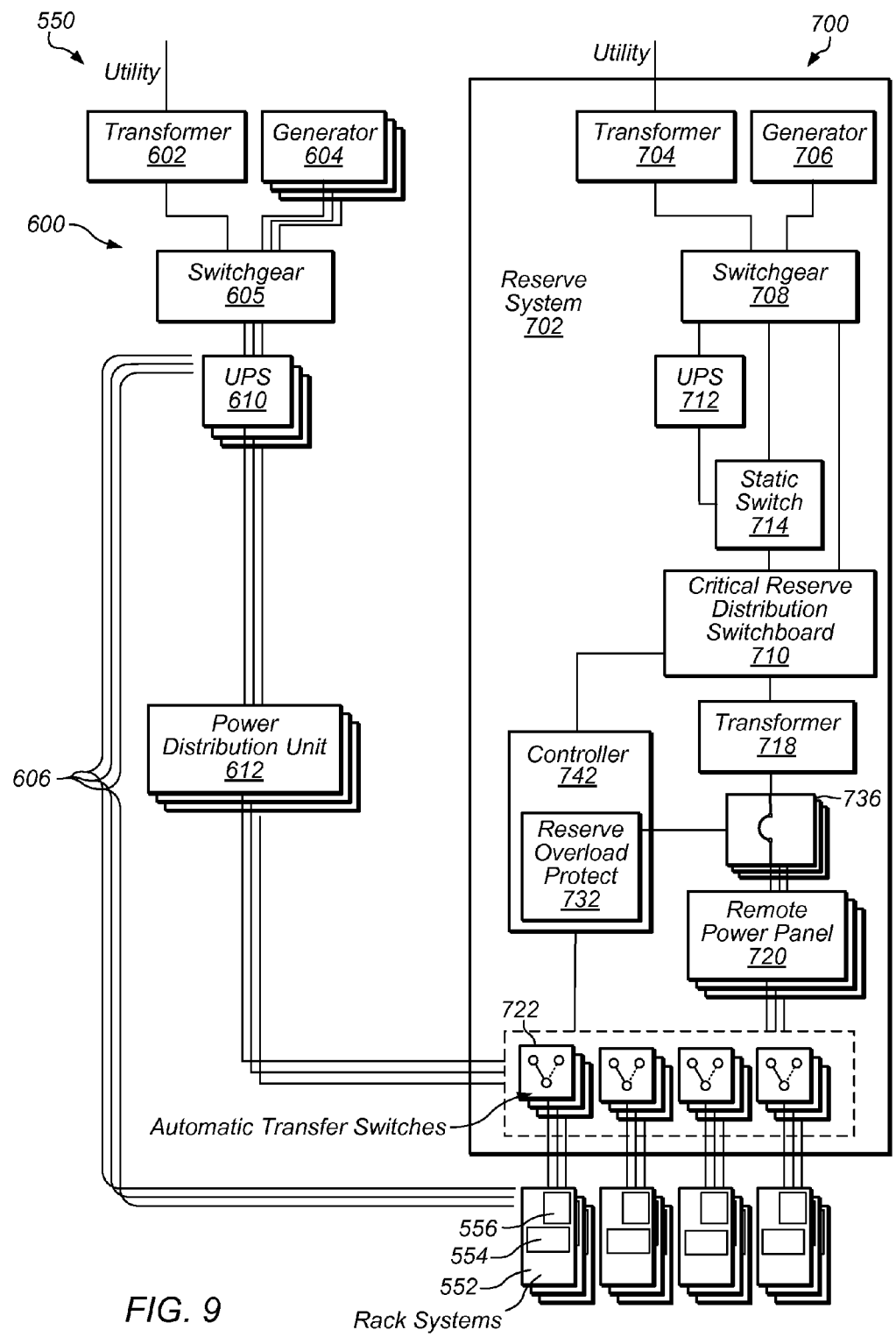
FIG. 9 is a block diagram illustrating one embodiment of a data center having a reserve power system that is enabled using automatic transfer switches.

FIG. 9 is a block diagram illustrating one embodiment of a data center having a reserve power system that is enabled using automatic transfer switches. In various embodiments, an automatic transfer switch may employ systems and methods for timing switch operation, such as described above relative to FIGS. 5-8. Data center 550 includes rack 552, primary power side 600, and reserve power side 700. Primary power side 600 includes transformer 702, generators 704, and switchgear 705, and primary power systems 706. Sets of computer systems 554 in racks 552 may perform computing operations in data center 550. Computer systems 554 may be, for example, servers in a server room of data center 550. Computer systems 554 in racks 552 may each receive power from one of primary power systems 606. In one embodiment, each of primary power systems 606 corresponds to, and provides power to, the servers in one room in data center 550. In one embodiment, each of primary power systems 606 corresponds to, and provides power to, one rack system in data center 602.

Primary power systems 606 each include UPS 610 and floor power distribution unit 612. Floor power distribution unit 612 provides power to various racks 552. In some embodiments, floor power distribution unit 612 includes a transformer that transforms the voltage from switchgear 605. Each of rack 552 may include a rack power distribution unit 556. Rack power distribution units 556 may distribute power to computer systems 554.

Transformer 602 is coupled to a utility feed. The utility feed may be a medium voltage feed. In certain embodiments, the utility feed is at a voltage of about 13.5 kilovolts or 12.8 kilovolts at a frequency of about 60 Hz. Generators 604 may provide power to primary power systems 606 in the event of a failure of utility power to transformer 602. In one embodiment, one of generators 104 provides back-up power for each of primary power systems 606. UPS 610 may provide uninterrupted power to racks 552 in the event of a power failure upstream from UPS 610.

Reserve power system 700 may provide reserve power for all of the computer systems 554 supplied by primary power systems 606. In some embodiments, reserve power system 700 is powered up at all times during operation of data center 550. Reserve power system 700 may be passive until a failure of one or more components of primary power side 200, at which time reserve power system 700 may become active.

For illustrative purposes, three primary power systems are shown in FIG. 1 (for clarity, details of only the front primary power system 606 are shown). The number of primary power systems 606 on primary power side 600 may vary, however. In certain embodiments, a primary power side may include only one primary power system. In addition, the number of power distribution units, UPSs, switchgear apparatus may vary from embodiment to embodiment (and, within a given embodiment, from system to system). In some embodiments, primary power system 106 includes many floor power distribution units 612. As another example, a primary power system may have one UPS that can supply power to many floor power distribution units.

Reserve power system 702 includes transformer 704 and generator 706. Transformer 704 may supply power to switchgear 708. Critical reserve distribution board 710 may receive power from switchgear 708. Power from switchgear 708 may pass through UPS 712. Static switch 714 is provided between UPS 712 and critical reserve distribution switchboard 710. Static switch 714 may provide for bypass of UPS 712 (for example, during maintenance of UPS 712).

Reserve power system 702 also includes transformer 718 and remote power panel 720. Transformer 718 may transform power from critical reserve distribution switchboard 708 and supply power to remote power panels 720. Remote power panels 720 may distribute power to servers 554 in racks 552. In one embodiment, each of remote power panels 720 of reserve power system 202 corresponds to one of floor power distribution units 612 of one of primary power systems 612. For example, if a floor power distribution unit distributes primary power to all of the computer systems in a rack, a remote power panel may distribute reserve power to all of the computer systems in that rack.

Reserve power system 702 also includes an array of automatic transfer switches 722. Automatic transfer switches 722 may control switching of power to computer systems 554 between primary power side 600 and reserve power side 700. automatically switch power from one of primary power systems 606 to reserve power system 702. In some embodiments, one automatic transfer switch is provided for each rack system in a computer room. Thus, an automatic transfer switch may switch input power to the rack between one of floor distribution units 612 and one of remote power panels 720. In another embodiment, an automatic transfer switch provided for each half of a rack system. In still another embodiment, automatic transfer switches may be provided at the server level. In certain embodiments, a reserve power system includes manual transfer switches. Manual transfer switches may be used, for example, to enable maintenance operations to be performed.

Although in the embodiment shown in FIG. 9, power to servers is switched between primary power and reserve power, in some embodiments, a data center may not have automatic transfer switches to switch between primary power and reserve power. In some embodiments, for example, servers in a rack system (such as servers 554 in racks 552) may be dual-supplied by two power systems or include power supplies that accept two our more power source inputs. A server may be sourced from two power feeds without an automatic transfer switch. In some embodiments, a redundant power system for servers in a data center may operate in an active-active failover configuration. In other embodiments, a redundant power system for servers in a data center may operate in an active-passive failover configuration.

Reserve power system 702 further includes controller 730. Controller 730 may serve various control functions in reserve power system 702. In some embodiments, controller 730 may control some or all of automatic transfer switches 722 in reserve power system 702. Controller 730 includes reserve overload protect circuit 732. In certain embodiments, controller 730 includes at least one programmable logic controller. The programmable logic controller may control some or all of the switching in or among devices in reserve power system 702.

In some embodiments, each automatic transfer switch is internally controlled. The automatic transfer switch may include fault detection circuitry such that when a fault condition is detected in the primary power input, the automatic transfer switch automatically switches to reserve power. Thus, for the computer systems coupled to the switch, in the event of a failure in any of the elements on primary power side 100 upstream from an automatic transfer switch 722, including floor power distribution unit 612, UPS 610, or switchgear 605, the automatic transfer switch may transfer input power from primary power to reserve power. Following such transfer, the computer systems that have been switched to reserve power may receive power from remote power panel 720 of reserve power system 702. In addition, the computer systems that have been switched to reserve power may be protected against power interruption by UPS 712. In one embodiment, failover from primary power to reserve power is carried out within about 8 to about 20 milliseconds.

Illustrative System

Figure 10:
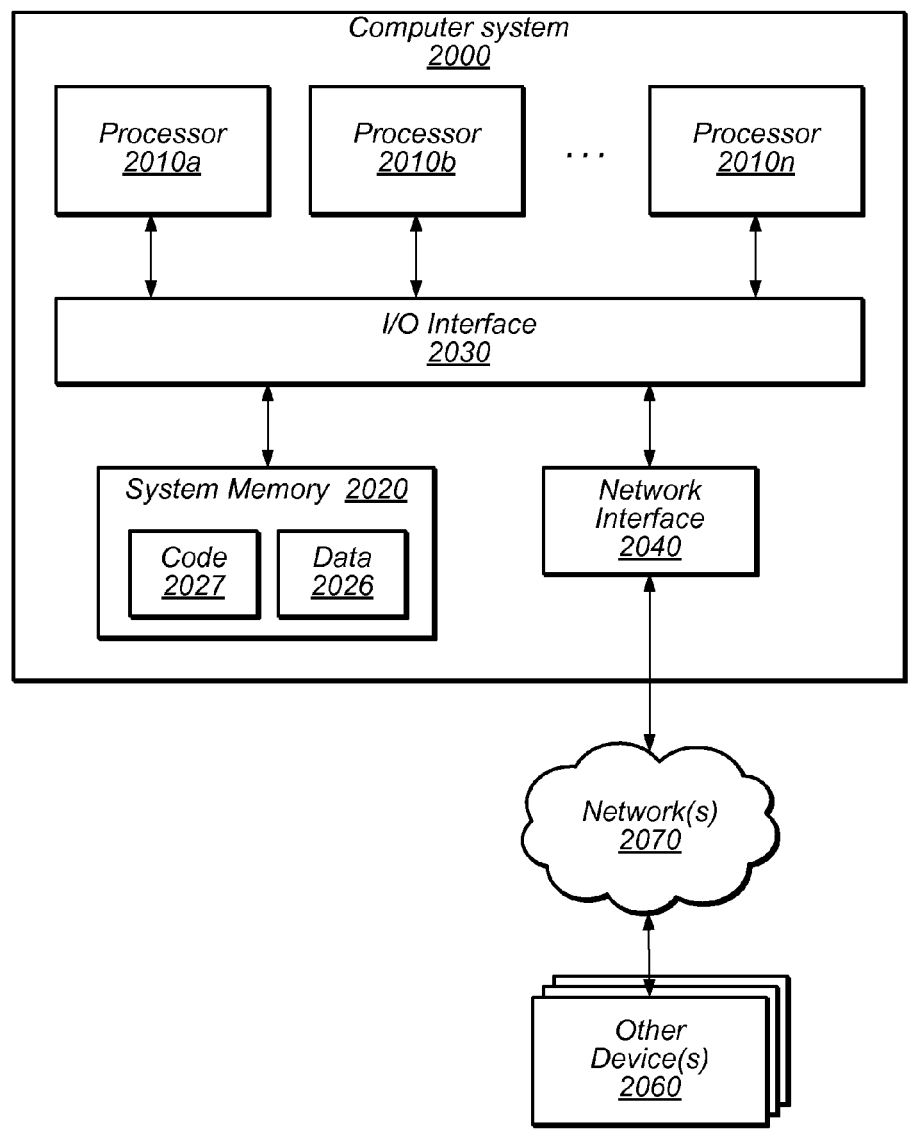
FIG. 10 illustrates a computer system on which various embodiments may be implemented.

In some embodiments, a server that implements a portion or all of one or more of the technologies, including the methods and apparatus for controlling devices as described herein, may include a general-purpose computer system that includes or is configured to access one or more computer-accessible media, such as computer system 2000 illustrated in FIG. 10. In the illustrated embodiment, computer system 2000 includes one or more processors 2010 coupled to a system memory 2020 via an input/output (I/O) interface 2030. Computer system 2000 further includes a network interface 2040 coupled to I/O interface 2030.

In various embodiments, computer system 2000 may be a uniprocessor system including one processor 2010, or a multiprocessor system including several processors 2010 (e.g., two, four, eight, or another suitable number). Processors 2010 may be any suitable processors capable of executing instructions. For example, in various embodiments, processors 2010 may be general-purpose or embedded processors implementing any of a variety of instruction set architectures (ISAs), such as the x86, PowerPC, SPARC, or MIPS ISAs, or any other suitable ISA. In multiprocessor systems, each of processors 2010 may commonly, but not necessarily, implement the same ISA.

System memory 2020 may be configured to store instructions and data accessible by processor(s) 2010. In various embodiments, system memory 2020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as those methods, techniques, and data described above for service provider methods and apparatus and the methods and apparatus for transferring data over a network, are shown stored within system memory 2020 as code 2025 and data 2026.

In one embodiment, I/O interface 2030 may be configured to coordinate I/O traffic between processor 2010, system memory 2020, and any peripheral devices in the device, including network interface 2040 or other peripheral interfaces. In some embodiments, I/O interface 2030 may perform any necessary protocol, timing or other data transformations to convert data signals from one component (e.g., system memory 2020) into a format suitable for use by another component (e.g., processor 2010). In some embodiments, I/O interface 2030 may include support for devices attached through various types of peripheral buses, such as a variant of the Peripheral Component Interconnect (PCI) bus standard or the Universal Serial Bus (USB) standard, for example. In some embodiments, the function of I/O interface 2030 may be split into two or more separate components, such as a north bridge and a south bridge, for example. Also, in some embodiments some or all of the functionality of I/O interface 2030, such as an interface to system memory 2020, may be incorporated directly into processor 2010.

Network interface 2040 may be configured to allow data to be exchanged between computer system 2000 and other devices 2060 attached to a network or networks 2050, such as other computer systems or devices as illustrated in FIGS. 1 through 12, for example. In various embodiments, network interface 2040 may support communication via any suitable wired or wireless general data networks, such as types of Ethernet network, for example. Additionally, network interface 2040 may support communication via telecommunications/telephony networks such as analog voice networks or digital fiber communications networks, via storage area networks such as Fibre Channel SANs, or via any other suitable type of network and/or protocol.

In some embodiments, system memory 2020 may be one embodiment of a computer-accessible medium configured to store program instructions and data for implementing embodiments of controlling devices as described above relative to FIGS. 1-9. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 2000 via I/O interface 2030. A non-transitory computer-accessible storage medium may also include any volatile or non-volatile media such as RAM (e.g. SDRAM, DDR SDRAM, RDRAM, SRAM, etc.), ROM, etc, that may be included in some embodiments of computer system 2000 as system memory 2020 or another type of memory. Further, a computer-accessible medium may include transmission media or signals such as electrical, electromagnetic, or digital signals, conveyed via a communication medium such as a network and/or a wireless link, such as may be implemented via network interface 2040.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc, as well as transmission media or signals such as electrical, electromagnetic, or digital signals, conveyed via a communication medium such as network and/or a wireless link.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method of operating an automatic transfer switch to switch an electrical load from one power source to another power source, comprising:
 measuring one or more characteristics of a switching circuit in the automatic transfer switch;

determining a value of one or more delays for the switching circuit, wherein the one or more delays comprise a delay between a control event and a closing of one or more relays of the automatic transfer switch, wherein the one or more delays are determined based, at least in part, on at least one of the measured characteristics of the switching circuit;

providing electrical power to the electrical load via the automatic transfer switch;

subsequently measuring at least one of the one or more characteristics of the switching circuit in the automatic transfer switch while electrical power is being provided to the electrical load via the automatic transfer switch;

adjusting the value of at least one of the one or more delays based, at least in part, on the at least one characteristic of the switching circuit measured while electrical power is being provided to the electrical load; and operating the switching circuit to close one or more of the relays in the automatic transfer switch, wherein the timing of the closing of at least one of the relays is based, at least in part, on the adjusted value of the at least one delay.

2. The method of claim 1, wherein the control event comprises an instruction executed in a controller of the automatic transfer switch.

3. The method of claim 1, wherein operating the switching circuit to close the one or more relays comprises operating the switching circuit such that closing of the at least one relay occurs within a predetermined time range relative to a zero crossing of a secondary power input to the automatic transfer switch.

4. The method of claim 1, wherein the measuring of the value of the one or more characteristics and the determining of the value of the one or more delays are performed during a self-configuration of the automatic transfer switch when the automatic transfer switch is placed into service, the method further comprising storing the at least one delay in a memory in the automatic transfer switch.

5. The method of claim 1, wherein measuring the one or more characteristics of the switching circuit comprises measuring one or more characteristics that vary based on manufacturing of one or more relays in the switching circuit.

6. The method of claim 1, wherein subsequently measuring the at least one of the one or more characteristics of the switching circuit comprises measuring one or more characteristics that vary based on the environmental conditions for the switching circuit.

7. The method of claim 1, wherein measuring the one or more characteristics of the switching circuit comprises measuring one or more characteristics that vary based on software used to control the switching circuit.

8. A method of operating a system having one or more electromechanical devices, comprising:

performing, by the system, a self-configuration, wherein performing the self-configuration comprises:

measuring, by the system, one or more characteristics of an electromechanical circuit in the system; and determining, by the system, a value of one or more delays for the electromechanical circuit, wherein the one or more delays comprise a delay between a control event and operation of one or more of the electromechanical devices, wherein the one or more delays are determined based, at least in part, on at least one of the measured characteristics of the electromechanical circuit;

placing the system into operation;

subsequently measuring at least one of the one or more characteristics of the electromechanical circuit while the system is in operation;

adjusting the value of at least one of the one or more delays based, at least in part, on the at least one characteristic of the electromechanical circuit measured while the system is in operation; and operating the electromechanical circuit, wherein operating the electromechanical circuit comprises controlling at least one of the electromechanical devices, wherein the timing of at least one operation of the at least one electromechanical device is based, at least in part, on the adjusted value of the at least one delay.

9. The method of claim 8, wherein the control event comprises an instruction executed in a controller of the system.

10. The method of claim 8, wherein operating the electromechanical circuit comprises operating the electromechanical circuit such that at least one action in the at least one electromechanical device occurs within a predetermined time range relative to one or more events.

11. The method of claim 8, wherein operating the electromechanical circuit comprises operating the electromechanical circuit such that at least one action in the electromechanical device occurs within a predetermined time range relative to a waveform of an electrical input, electrical output, or electrical signal.

12. The method of claim 8, wherein the self-configuration is performed when the system is placed into service, further comprising storing the at least one delay in a memory in the system.

13. The method of claim 8, wherein the self-configuration is performed after the system has been placed into service, wherein determining of the value of the at least one delay comprises adjusting the value of the delay based on at least one change in a value of at least one of the measured characteristics.

14. The method of claim 8, wherein measuring the one or more characteristics of the electromechanical circuit comprises measuring one or more characteristics that vary based on manufacturing of at least one of the electromechanical devices in the electromechanical circuit.

15. The method of claim 8, wherein measuring the one or more characteristics of the electromechanical circuit comprises measuring one or more characteristics that vary based on a batch of at least one of the electromechanical devices in the electromechanical circuit.

16. The method of claim 8, wherein measuring the one or more characteristics of the electromechanical circuit comprises measuring one or more characteristics that vary based on a source of supply of at least one of the electromechanical devices in the electromechanical circuit.

17. The method of claim 8, wherein subsequently measuring the at least one of the one or more characteristics of the electromechanical circuit comprises measuring one or more characteristics that vary based on the environmental conditions for the electromechanical circuit.

18. The method of claim 8, wherein measuring the one or more characteristics of the electromechanical circuit comprises measuring one or more characteristics that vary based on software used to control the electromechanical circuit.

19. The method of claim 18, further comprising disabling the system if at least one of the measurements during self-configuration fails to fall within a predetermined acceptable range.

20. The method of claim 18, further comprising sending an alarm if at least one of the measurements during self-configuration fails to fall within a predetermined acceptable range.

21. A system, comprising:
    at least one processor; and
    a memory comprising program instructions, wherein the program instructions are executable by the at least one processor to implement:
        performing a self-configuration of the system, wherein performing the self-configuration of the system comprises:
            measuring one or more characteristics of an electromechanical circuit in the system; and
            determining a value of one or more delays for the electromechanical circuit, wherein the one or more delays comprise a delay between a control event and operation of one or more electromechanical devices in the system, wherein the one or more delays are determined based, at least in part, on at least one of the measured characteristics of the electromechanical circuit;
        subsequently measuring at least one of the one or more characteristics of the electromechanical circuit while the system is in operation;
        adjusting the value of at least one of the one or more delays based, at least in part, on the at least one characteristic of the electromechanical circuit measured while the system is in operation; and
        operating the electromechanical circuit, wherein operating the electromechanical circuit comprises controlling at least one electromechanical device of the one or more electromechanical devices in the system, wherein the timing of at least one operation of the at least one electromechanical device is based, at least in part, on the adjusted value of the at least one delay.

22. The system of claim 21, wherein operating the electromechanical circuit comprises controlling the at least one electromechanical device such that at least one action in the at least one electromechanical device occurs within a predetermined time range relative to one or more events.

23. The system of claim 21, wherein measuring the one or more characteristics of the electromechanical circuit comprises measuring one or more characteristics that vary based on manufacturing of at least one of the electromechanical devices in the electromechanical circuit.

24. A non-transitory computer-readable storage medium storing program instructions, wherein the program instructions are computer-executable to implement:
    performing a self-configuration of a system, wherein performing the self-configuration of the system comprises:
        measuring one or more characteristics of an electromechanical circuit in the system; and
        determining a value of one or more delays for the electromechanical circuit, wherein the one or more delays comprise a delay between a control event and operation of one or more electromechanical devices in the system, wherein the one or more delays are determined based, at least in part, on at least one of the measured characteristics of the electromechanical circuit;
    subsequently measuring at least one of the one or more characteristics of the electromechanical circuit while the system is in operation;
    adjusting the value of at least one of the one or more delays based, at least in part, on the at least one characteristic of the electromechanical circuit measured while the system is in operation; and
    operating the electromechanical circuit, wherein operating the electromechanical circuit comprises controlling at least one of the one or more electromechanical devices, wherein the timing of at least one operation of the at least one electromechanical device is based, at least in part, on the adjusted value of the at least one delay.

25. The non-transitory computer-readable storage medium of claim 24, wherein operating the electromechanical circuit comprises controlling the at least one electromechanical device such that at least one action in the at least one electromechanical device occurs within a predetermined time range relative to one or more events.

26. The non-transitory computer-readable storage medium of claim 24, wherein measuring the one or more characteristics of the electromechanical circuit comprises measuring one or more characteristics that vary based on manufacturing of at least one of the electromechanical devices in the electromechanical circuit.

27. An automatic transfer switch, comprising:
    one or more relays configured to switch power to one or more power outputs;
    at least one processor; and
    a memory comprising program instructions, wherein the program instructions are executable by the at least one processor to implement:
        measuring one or more characteristics of a switching circuit including at least one of the relays;
        determining a value of one or more delays for the switching circuit, wherein the one or more delays comprise a delay between a control event and operation of one or more of the relays in the automatic transfer switch, wherein the one or more delays are determined based at least in part on at least one of the measured characteristics of the switching circuit;
        subsequently measuring at least one of the one or more characteristics of the switching circuit in the automatic transfer switch while electrical power is being provided to an electrical load via the automatic transfer switch;
        adjusting the value of at least one of the one or more delays based, at least in part, on the at least one characteristic of the switching circuit measured while electrical power is being provided to the electrical load; and
        operating the switching circuit to close one or more of the relays in the automatic transfer switch, wherein the timing of the closing of at least one of the relays is based, at least in part, on the adjusted value of the at least one delay.

28. The automatic transfer switch of claim 27, wherein the at least one relay switches power for a secondary power input of the automatic transfer switch.

29. The automatic transfer switch of claim 28, wherein the automatic transfer switch is configured to close the at least one relay within a predetermined range of a zero crossing of the secondary power input of the automatic transfer switch.

30. A method of self-configuration of a system having one or more electromechanical devices, comprising:
    measuring, by the system, one or more characteristics of an electromechanical circuit in the system, wherein the one or more characteristics comprise an environmental condition of the electromechanical circuit including at least one of: a temperature, an ambient pressure, or a humidity; and determining, by the system, a value of one or more delays for the electromechanical circuit, wherein the one or more delays comprise a delay between a control event and operation of one or more of the electromechanical devices, wherein the one or more delays are determined based, at least in part, on at least one of the measured characteristics of the electromechanical circuit, wherein the value of the one or more delays are configured for use by the system in controlling timing of at least one operation of at least one of the electromechanical devices; and storing the value of at least one of the one or more delays in a memory.

* * * * *